US008767175B2

(12) United States Patent
Sandström

(10) Patent No.: US 8,767,175 B2
(45) Date of Patent: Jul. 1, 2014

(54) 1.5D SLM FOR LITHOGRAPHY

(75) Inventor: Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 492 days.

(21) Appl. No.: 13/039,217

(22) Filed: Mar. 2, 2011

(65) Prior Publication Data

US 2011/0242514 A1    Oct. 6, 2011

Related U.S. Application Data

(60) Provisional application No. 61/311,276, filed on Mar. 5, 2010.

(51) Int. Cl.
*G03B 27/42* (2006.01)

(52) U.S. Cl.
USPC ............... 355/53; 355/55; 355/63; 355/67; 355/77

(58) Field of Classification Search
CPC ............. G02B 26/0808; G03F 7/0291; G03F 7/70583; G03B 27/54; G03B 27/16; G03B 27/28
USPC .......................... 355/53, 63, 67, 77; 430/5, 30
See application file for complete search history.

(56) References Cited

U.S. PATENT DOCUMENTS

| | | | |
|---|---|---|---|
| 5,523,193 A | 6/1996 | Nelson | |
| 6,870,172 B1 | 3/2005 | Mankos et al. | |
| 7,719,753 B2 | 5/2010 | Meisburger | |
| 2005/0219502 A1* | 10/2005 | Sandstrom et al. | 355/77 |

* cited by examiner

*Primary Examiner* — Steven H Whitesell Gordon
*Assistant Examiner* — Mesfin T Asfaw
(74) *Attorney, Agent, or Firm* — Haynes Beffel & Wolfeld LLP; Christopher Blizzard

(57) ABSTRACT

This invention relates to an improved micro lithographic writer that sweeps a modulated pattern across the surface of a workpiece. The SLM disclosed works in a diffractive mode with a continuous or quasi-continuous radiation source. It uses a long and narrow SLM and takes advantage of diffractive effects along the narrow axis of the SLM to improve writing characteristics along that axis.

14 Claims, 7 Drawing Sheets

1.5D SLM FOR LITHOGRAPHY

RELATED APPLICATION

This application claims the benefit of U.S. Provisional Patent Application No. 61/311,276, filed 5 Mar. 2010, entitled "1.5d Slm For Lithography". The priority application is incorporated by reference.

This application also relates to U.S. patent application Ser. No. 12/718,895, filed 5 Mar. 2010, entitled "Rotor Imaging System And Method With Variable-Rate Pixel Clock", which is incorporated by reference.

The embodiments disclosed reflect work done by a team of inventors all working for Micronic Laser AB, now known as Micronic Mydata AB. All of the inventors working on this project were obligated at the time of invention to assign their inventions to a common assignee.

BACKGROUND OF THE INVENTION

This invention relates to an improved micro lithographic writer that sweeps a modulated pattern across the surface of a workpiece. The SLM disclosed works in a diffractive mode with a continuous or quasi-continuous radiation source. It uses a long and narrow SLM and takes advantage of diffractive effects along the narrow axis of the SLM to improve writing characteristics along that axis.

Over time, optically-based systems for micro lithography have become increasingly sophisticated. Systems from more than a decade ago relied on swept laser beams, typically modulated using an acousto optical modulator. In the last decade, systems have been developed that use micro mirrors or deformable micro mirror devices to flash-stamp portions of the pattern, in so called maskless steppers. Under development are systems that use a narrow, one-dimensional micromirror array to sweep continuous or quasi-continuous laser energy across a substrate. Over the same period, the typical wavelength used for imaging has become shorter. The common characteristic of optically based systems has been a throughput advantage over competing e-beam systems.

Recent systems sweep radiation from a modulated one-dimensional micro-mirror array across the substrate. Advantages are high through-put, good utilization of the optical field, and the use of essentially-continuous lasers. An example is shown in FIG. 1 taken from application Ser. No. 12/718,895 by the same applicant. The figure shown depicts shows the SLM image as a square indicating a 2D SLM, but alternative forms with a 1D SLM can be found in the same application.

These systems using a 1D SLM provide good resolution and image characteristics across the long axis of the array, but provide much less favorable image characteristics in the direction of sweep, along the narrow axis of the array. Image characteristics along the length of the array benefit from use of diffraction effects between adjoining mirrors illuminated with partially coherent or locally coherent radiation. This is not an option along the direction of sweep, as interference depends on instantaneous interaction between radiation relayed from adjoining or adjacent the micro mirrors. Along the direction of sweep, adjacent pixels are printed at different times, so there is no interference.

Sigma™ tools, Micronic Laser's own flash and step systems based on a 2D SLM, are expensive and complex. Driving a million or more micro mirrors at ?? kHz frame rates requires an enormous amount of computation in a complex data path and the SLM device itself is complex.

One ancestor of Micronic Laser's Sigma™ tool is found in U.S. Pat. No. 5,523,193. In this patent, Nelson of Texas Instruments, describes an early generation of the deformable micro-mirror device. In column 7, the patent describes using an area array spatial light modulator in a flash-stamp and step mode similar to conventional mask-based stepper.

Another maskless lithography approach is found in U.S. Pat. No. 7,719,753. While the specification mentions many options in column 4, the principal teachings of the application from column 10 through column 16 involve use of a standard Texas Instruments deformable micro-mirror device. The preferred device, specified in column 16, is 1024 mirrors wide by 768 mirrors deep, corresponding to an early generation of HDTV. As the illumination source identified at the bottom of column 5 is an incoherent arc lamp. Accordingly, this patent teaches use of a new of device it is relatively difficult to keep loaded with data, that does not benefit from use of locally coherent or partially coherent illumination.

Also in the field of micro-lithography, but utilizing electron beams, is U.S. Pat. No. 6,870,172. This patent describes the so-called reflected electron beam lithography (REBL) system produced by KLA-Tencor Technologies. Like the preceding patent, it proposes use of a rectangular large array, with 4000× 1000 individually addressed elements. It is an electron beam system, rather than an optical system.

As described above, modulated one-dimensional micromirror array systems have asymmetrical image characteristics. This complicates the patterning of substrates and is at odds with image characteristics of steppers. It would be useful to have a system that sweeps a one-dimensional micromirror SLM with essentially symmetrical image characteristics in and across the direction of sweep.

A better, more symmetrical system that sweeps a micromirror generated image across the substrate will be less complex and less expensive than flash-stamp and step systems. Additional applications can be devised for a more symmetrical system that cost-effectively uses fewer micro mirrors and relatively low-cost optical radiation sources.

SUMMARY OF THE INVENTION

This invention relates to an improved micro lithographic writer that sweeps a modulated pattern across the surface of a workpiece. The SLM disclosed works in a diffractive mode with a continuous or quasi-continuous radiation source. It uses a long and narrow SLM and takes advantage of diffractive effects along the narrow axis of the SLM to improve writing characteristics along that axis. Particular aspects of the present invention are described in the claims, specification and drawings.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 2:
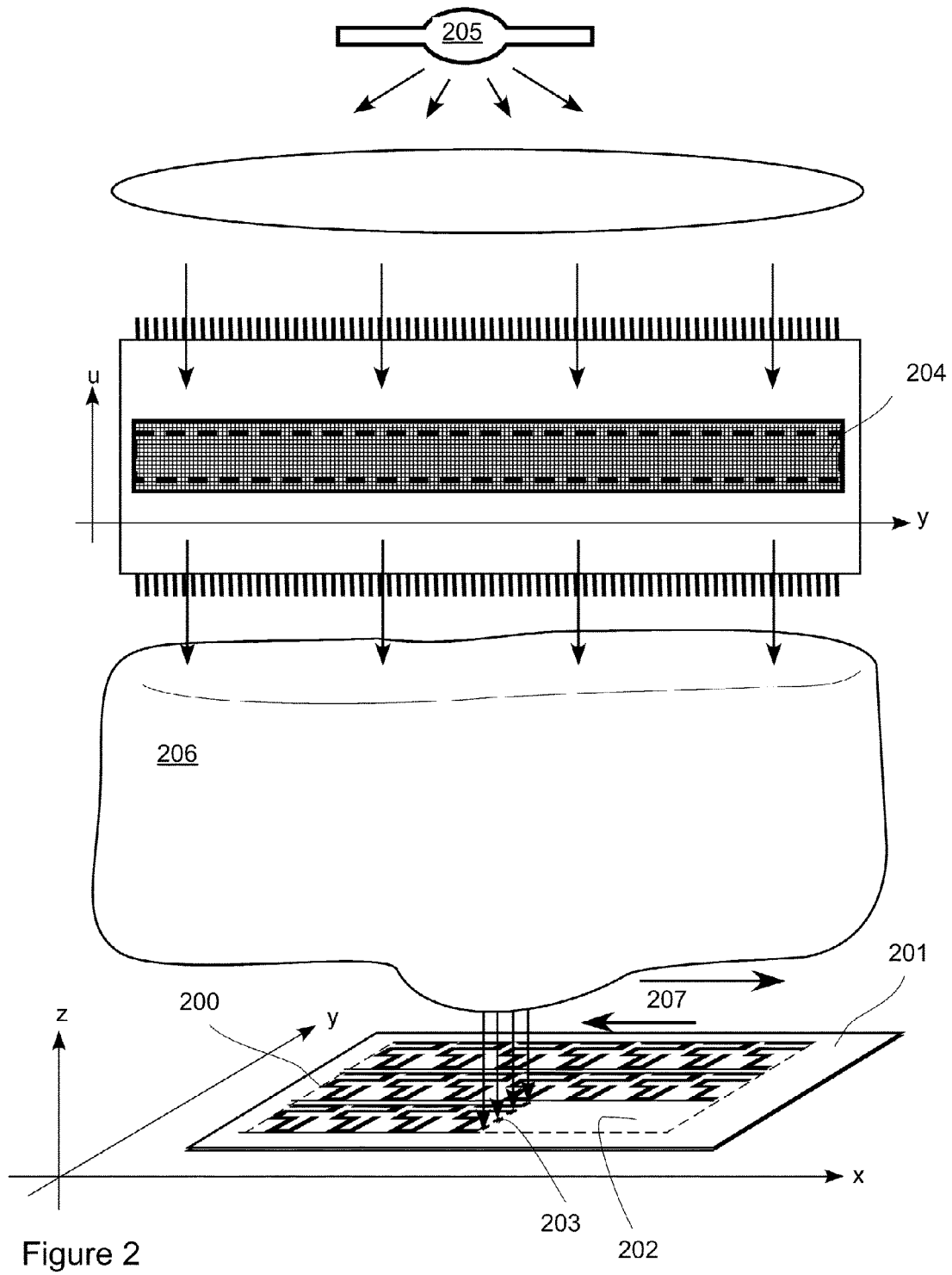
FIG. 2 further describes use of a so-called one-dimensional SLM with anamorphic optics.
Figure 3:
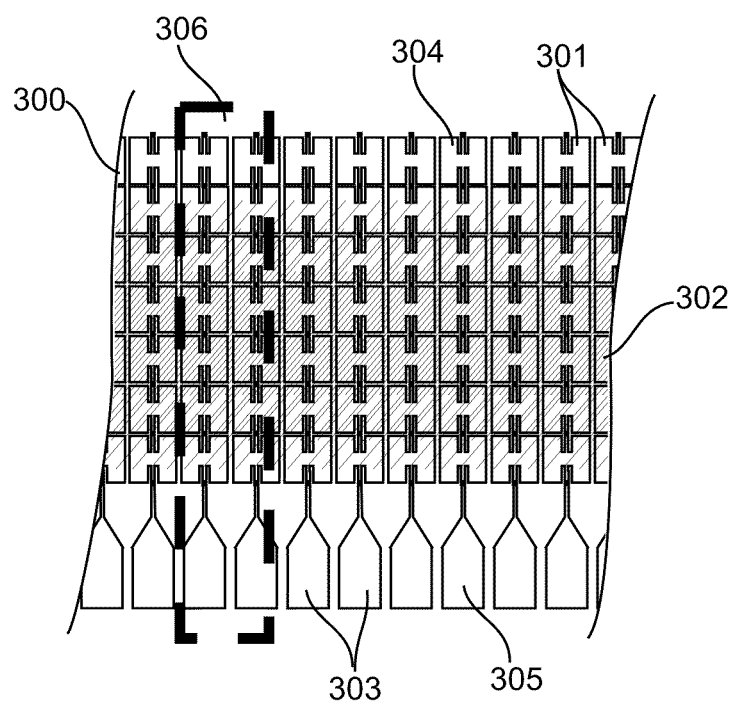
FIG. 3 depicts operation of other 1D SLM-based writers.

A useful starting point for understanding the technology disclosed is the operation of other SLM-based writers, including those depicted in FIGS. 2 and 3. In a swept SLM system with pixels that are sequentially written in the direction of sweep, bits of the pattern written at different times do not interfere. At the image plane or in the radiation sensitive layer over the workpiece, light wave hitting the surface with an amplitude a produce for each pixel an illumination intensity $i=|a|^2$. If radiation at one pixel of the workpiece receives the illumination $i_1$ at one time, a later pixel radiation intensity $i_2$ at the same pixel can only add to the intensity, rather than modifying the amplitude of the exposing radiation. That is, the effect of the two successive illuminations of the pixel is $i_{sum}=i_1+i_2=|a_1|^2+|a_2|^2$, where the first exposing radiation has the amplitude $a_1$ and the second $a_2$. This is the result for using incoherent exposing radiation.

In swept SLM devices, along the long axis of the SLM, direction, illumination of micro mirrors is partially or locally coherent. That is, two adjoining pixels are coherently illuminated and will produce interference with each other in the image. Together they give the amplitude $a_{sum}$ which, depends on the phase angles of radiation relayed by the respective mirrors. Coherence effects, depending on relative phase, produce an amplitude between $(|a_1|-|a_2|)$ and $(|a_1|+|a_2|)$ and illumination value $i_{sum}$ between $(|a_1|-|a_2|)^2$ and $(|a_1|+|a_2|)^2$, where $a_2$ is chosen as the component having the smaller amplitude. A second pixel can therefore either add or subtract amplitude from a first pixel. The sum of amplitudes (either additive or subtractive) is squared to calculate the resulting intensity. This is called partially coherent imaging. The interference between neighbouring pixels may be tuned by the coherence function, which is determined by the angular distribution of light impinging on the SLM. By choosing different angular distributions one may create an image which closely resembles the reflection pattern on the SLM or alternatively one where all edges are enhanced by interference. In lithography images with a certain amount of interference ringing is generally preferred, since it enhances the printing of thin lines. The theory can be found in textbooks on optics, such as Born & Wolf, "Principles of Optics" and commercial software such as Panoramic from PanoramicTech may be used to fine-tune the printing properties. This flexibility and enhancement of small features exist in the coherent or long direction of the SLM. In the short or scanning direction the image is built from the sequential printing of a single row of pixels shifted across the surface of the area. This gives much less flexibility and in particular lacks the option to enhance small features. We call this the incoherent direction.

In a swept system, having a single row of SLM pixels, the pixels written along the long and narrow axes of the SLM will have properties which are different in several aspects: different doses to print at the size in data, different iso-focal doses, different resolution and different depth of focus. Applying an asymmetrical numerical aperture (NA) can partially equalize properties along the long and narrow axes, for instance by making the resolution be the same, but equalizing the resolution does not correct differences in the depth of focus or in isofocal dose. In practice the worst direction, typically the incoherent writing direction of sweep, will determine the writing properties of such a system, the smallest feature which can be written, the size of the optics, etc.

We disclose a method and apparatus using what we call a 1.5D SLM. A 1D SLM has N×1 pixels and a 2D SLM may have 2000×500 or 1024×768 pixels. We call a device a 1.5D SLM when it has N×M pixels, where N is a large number such as 1024, 2048, 4096, 8192 or 16384 and M is a much smaller number, less than or equal to 20, for instance 2, 3, 4, 5, 6, 8, 10, 15 or 20 pixels.

Figure 6A:
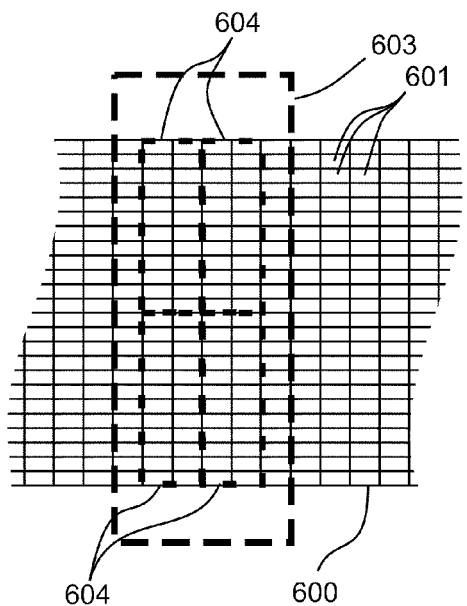
FIGS. 6A-6D show sections of 1.5D SLMs with 2, 3, 4, and 8 pixels across the direction of sweep pixels composed of a single and of multiple mirrors.

By pixel we mean an area of the SLM which is treated in the datapath as one unit and which is assigned a pixel value. In some cases a pixel may be a single micro mirror, in others a pixel may be a collection of mirrors controlled by the same pixel value. In FIG. 6A a section of a 1.5D SLM 600 with M=2 is shown. There are many small mirrors 601 and clusters of them form pixels 604. For diffractive operation, the mirrors can be controlled in an analog fashion, i.e. they can be set to one of many states as dictated by the pixel value. Another important aspect is that they work by diffraction, i.e. by controlling the phase of the light and indirectly modulate the intensity of the pixel by interference within and between mirrors. Given that the mirrors are made accurate enough to interfere with each other in a predictable way multiple mirrors can be used as one pixel and still form a single diffraction limited spot on the workpiece.

Figure 6B:
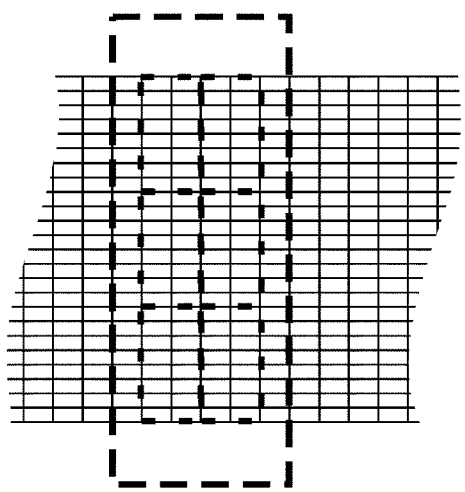
Figure 6C:
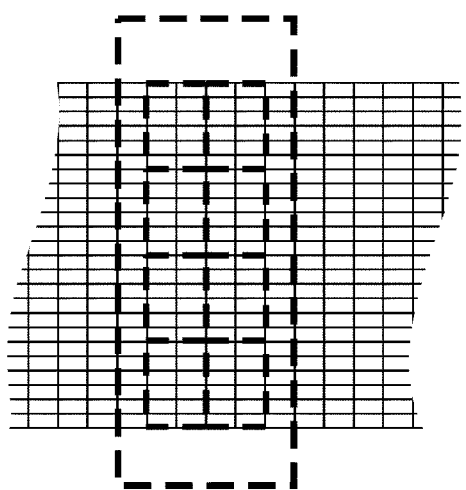
Figure 6D:
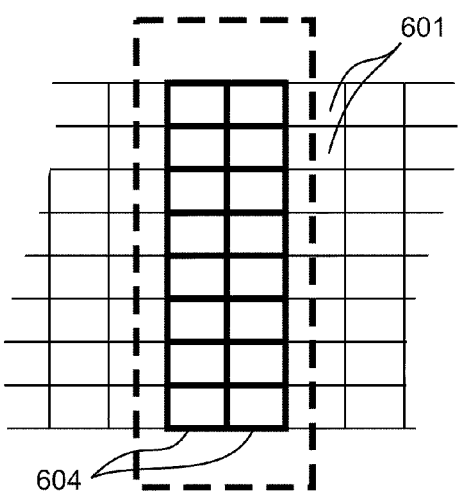

The mirrors within one pixel are controlled by the same pixel value. However the mirrors need not be controlled identically, e.g. some mirrors may tilt left and others tilt right. The device is illuminated by a laser beam which is essentially coherent over an area 603 which spans a few pixels in the long (horizontal) direction and the entire device width in the short direction. FIGS. 6B and 6C illustrate that M=3 and 4 respectively. They include more rows in the direction of sweep. FIG. 6D shows M=8 and also shows that each pixel 604 may consist of only one mirror 601. The invention is not limited to pixels with many mirrors, although most examples and figures show such SLMs.

Figure 4:
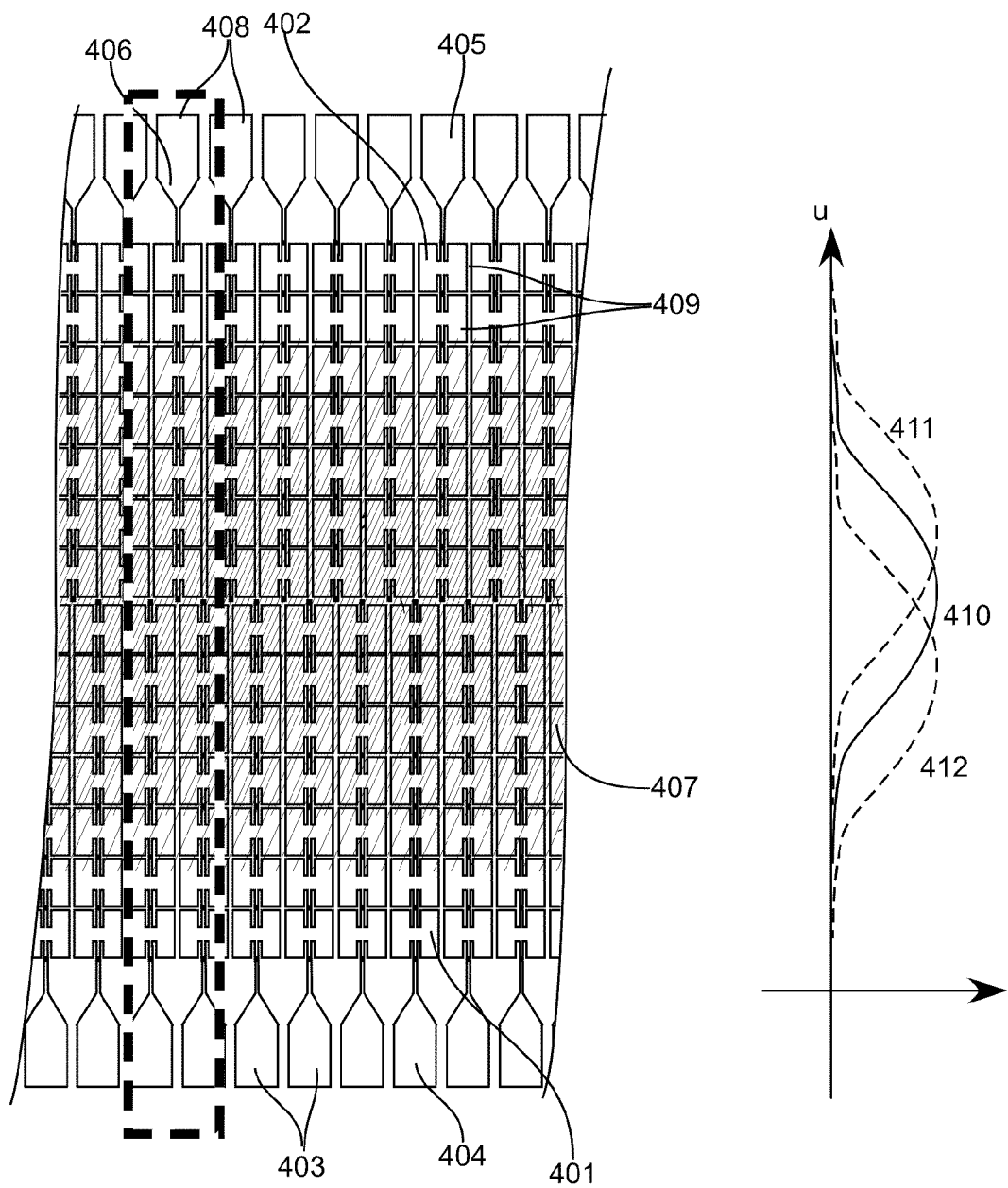
FIG. 4 shows a cross-section of an 1.5D SLM with M=2.

The 1.5D SLM, unlike the prior art is by partially coherent light in the long direction and by a coherent light distribution in the short direction, with coherence that spans over more than one pixel. In particular the coherence may span the entire device (or the illuminated part of it) in the short direction. Alternatively, as illustrated in FIG. 4, the illumination in the short direction may consist of a small number of coherent but mutually incoherent light distributions, 410, 411, 412, each spanning over more than one pixel or the entire width of the device.

Use of the 1.5D SLM helps resolve different properties in x and y, which the 1D SLM suffers. The 1D SLM is attractive to systems designer, because it can be illuminated with a continuous laser or a pulsed laser that operates at a frequency which is at least as high as the number of pixel scanned over per time unit and sometimes in the tens or hundreds megahertz range. The 1D SLM uses the optical field efficiently and it can be swept either perpendicular to the array or at an angle. It can be swept along a straight line or a curvilinear path.

To explain how this technology alleviates asymmetry in the image, it is useful to consider imaging theory. In the long direction, the SLM is illuminated by partially coherent light. Partial coherence means that the electric fields in two points are correlated if the points are close to each other and not correlated if the points are separated by some distance. The magnitude of the correlation is a function of the separation distance. The magnitude is called the coherence function. The coherence function is determined by the angular distribution of the light illuminating the SLM by the Van Cittert-Zernike theorem in coherence theory. It is not uncommon in lithography that the area over which there is high coherence is chosen to be three to four pixels across. Once the coherence function is known the image properties can be calculated or simulated using commercial software. One way to calculate the image is to divide the light source into a cloud of mutually incoherent source points, calculate the image produced by the light from each source point, and sum up all the images.

To calculate the image from a 1D SLM in the scanning direction one calculates the image assuming coherence for each position during scanning and sums up all images. There is no interference between neighboring pixels, because there is only one pixel involved in each image. Images of different pixels are printed at different points in time.

For the 1.5D the illumination is still coherent in the short direction, but two or more pixels are used for each image and they may interfere with each other. The next image is calculated with the workpiece moved by one pixel unit and the data loaded into the SLM is modified accordingly. The image is the sum of the images produced while the image line is scanned across. Somewhat surprisingly this gives an image with the similar properties as the one produced by the partially coherent illumination in the long direction. The intensity profile of the illumination across the SLM has the function of the coherence function in the long direction. To get small asymmetry the illuminated area in the short direction should be approximately the same size as the size of the coherence function in the long direction. The image is easily calculated as a sum of coherent images and the illumination profile may be modified, e.g. with filters in a Fourier plane, to fine-tune the image properties. Creating an image using coherent light with the properties of a partially coherent image has been described in a different context in U.S. Pat. No. 7,215,409, by the same inventor.

Figure 7:
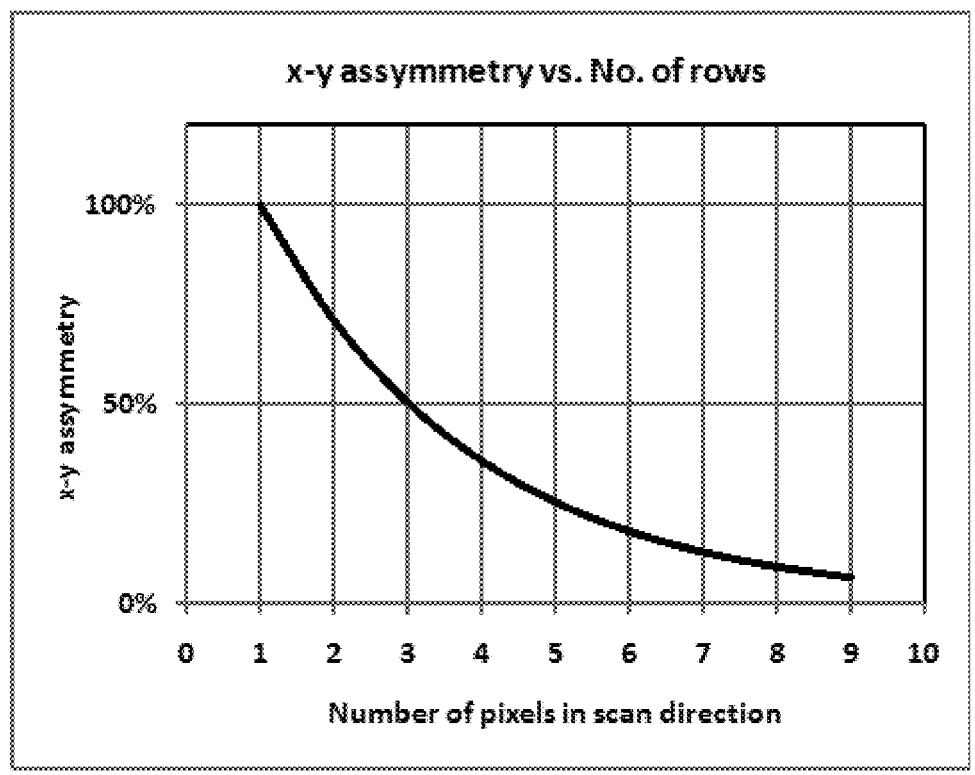
FIG. 7 shows in principle how the amount of x-y asymmetry in a printed image is reduced with increasing number of pixels in the scanning direction.

In a 1.5D SLM with only two rows, where M=2, there is only a partial equalization between the directions. Advantage is gained already with M=2, e.g. the enhancement of thin dark lines. For more rows, M=3, M=4 or higher numbers gives more equal properties. Good printing of thin bright lines needs M=4 or higher. For M=8 or 10, the properties are essentially indistinguishable between x and y. FIG. 7 shows how the x-y asymmetry goes down with increasing number of pixels M. The figure is only indicative of the general behavior and the exact shape may vary from system to system depending on pixel size, NA, method for rasterization, and of course which type of asymmetry is plotted.

At the same time the number of pixel values electronically fed to the SLM is proportional to M and the trade-off between pixel rate and effectiveness of the equalization has to be determined from case to case. In the specific case there will be a trade-off which has to be resolved by detailed calculations, comparison to the detailed requirements, and estimations of system performance and cost using different alternatives.

FIG. 4 shows a cross-section of an 1.5D SLM with M=2. Each pixel 401, 402 is formed by many mirrors 409 driven by a common terminal 404. The array is divided into two parts (the pixels of which are shown staggered for clear illustration. The two parts are driven from the top terminals 408 and from the bottom 403. The illumination is distributed and coherent over both pixels and has coherent areas 408 in the long direction. When the SLM image is translated similarly formed coherence areas will be sequentially formed in the x direction thereby creating symmetry between x and y. The projection optics may have different demagnification in x and y. The mirrors can be of several types, e.g. tilting or moving up and down; diamond-shaped, rectangular, H-shaped; flat or with phase steps as detailed in previous patent applications assigned to Micronic Laser Systems AB or Micronic MyData AB.

The illumination intensity I across the SLM is shown as 410. The illumination 410 is coherent in the u direction. Alternatively there can be two or more internally coherent but mutually incoherent light distributions 411, 412 at least partly illuminating both pixels. They may come from two different lasers or from one laser and separated by time delay of the laser pulses or by polarization.

Application Environments

Environments in which the technology disclosed is particularly useful include a rotating arm printing device with relay optics with a hub at one end of the arm and optics at the other end, which couple image information with the surface of a workpiece. The optical coupling at the hub may be either on or off the axis of rotation. The following section provides background on the inventive rotor system that is useful for understanding the role of the 1.5 D SLM.

A rotor arm system can write to a workpiece. It uses a stationary optical image device to modulate relayed image information. It relays the image information along optics of at least one rotating arm between the stationary optical image device and a surface of the workpiece. By repeatedly sweeping a curved stripe across the surface of the workpiece, a contiguous image may be written from overlapping partial images by stitching together sequential images of the SLM on the workpiece.

The rotor can have several arms, e.g. 2, 3, 4, 6, or 8 arms, thereby multiplying the scanned surface area per time unit. Heavy, complex, fragile machine parts, or parts that are expensive or need many connections and services can be placed stationary near the center or hub of the rotor and be shared by the multiple arms. An image is relayed between a stationary image device placed at or near the hub of the rotor and the workpiece, through the radial arm.

Figure 1:
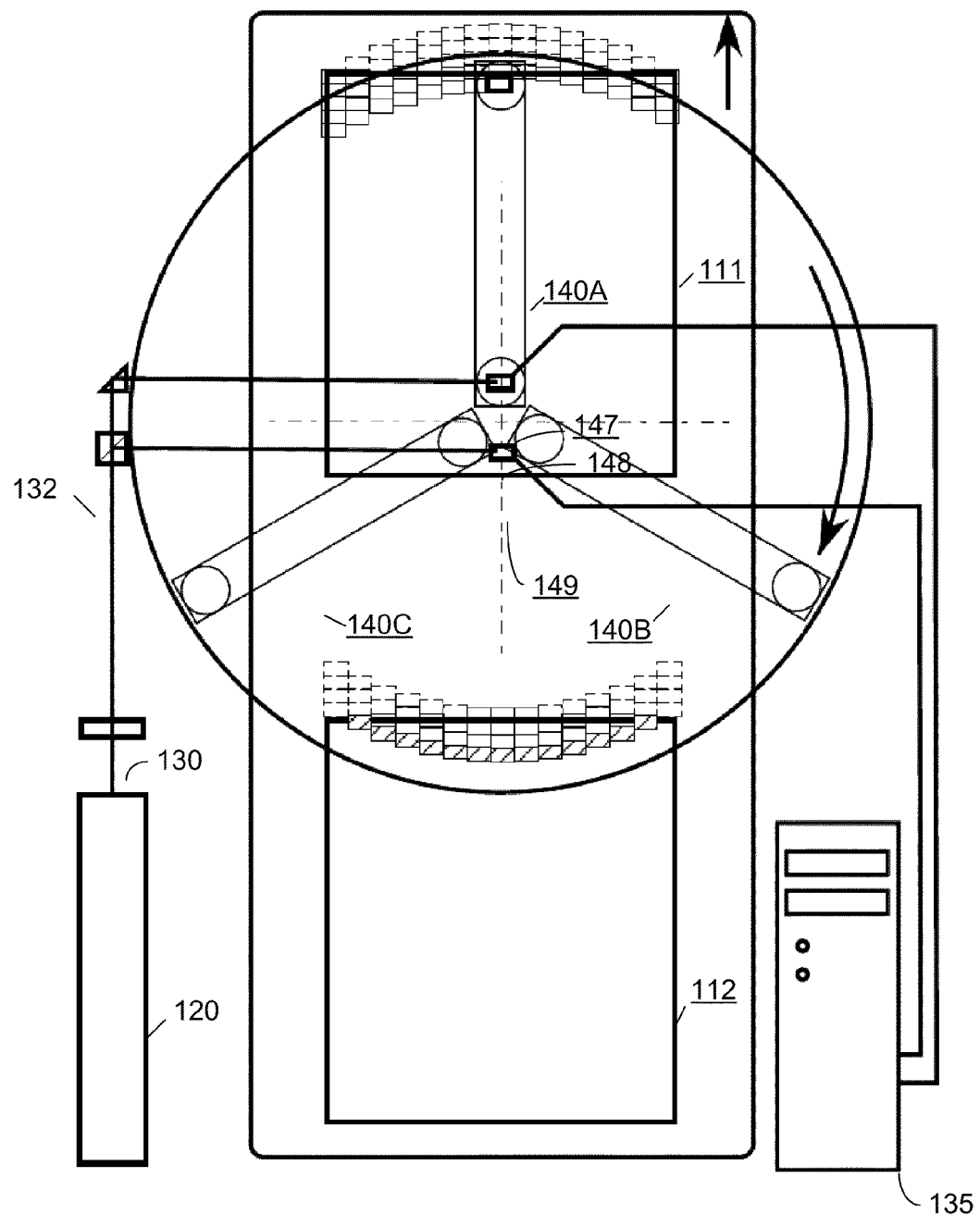
FIG. 1 depicts a scanning system with three arms and a pair of workpieces being written on opposite sides of the hub.

FIG. 1 depicts an example rotor scanning system with three arms and a pair of workpieces 111, 112 being written on opposite sides of the hub 148. This system may have a duty cycle of 100%. Each rotor writes through an arc of 60 degrees. Only one arm 140 writes at a time, alternatively on the two workpieces Some particularly useful applications of this technology involve writing patterns on electronic substrates, such as: wafers' front and back sides; PCBs; build-up, interposer and flexible interconnection substrates; and masks, stencils, templates and other masters. Likewise, the rotor writer can be used for patterning panels in displays, electronic paper, plastic logic and photovoltaic cells. The patterning can be done by exposure of photoresist, but also through other actions of light such as thermal or photochemical processes: melting, evaporation, ablation, thermal fusing, laser-induced pattern transfer, annealing, pyrolytic and photo induced etching and deposition.

A rotor system replaces the customary motion of a Cartesian flatbed xy stage with a polar scanning motion. Potential benefits include high throughput, low cost and mechanical simplicity. The scanning action is done by a rotating motion, which is mechanically easier to build to high accuracy than straight-line motion. The position accuracy of a point on the periphery of the rotor is determined by the quality of a bearing and the accuracy of an angle encoder. Both of these components can be sourced with high quality. A rotational reduces vibrations and transient forces during scanning and between scanning strokes. A well-balanced rotor emits essentially no vibrations or reactive forces to the supporting structure, while reciprocating straight movements need to reverse their momentum twice per stroke and create strong disturbances when doing so. A rotor may have a higher scanning velocity with less mechanical overhead. A rotor with several arms uses nearly the whole circle for writing. For instance, a rotor with four arms may scan through an 80 degree arc. Out of the 360 degrees in a circle, the rotor scans during 4×80=320 degrees. A reciprocating movement needs more mechanical overhead. The overhead for reciprocating movement gets larger with increased scanning velocity.

Rotor systems may have a very high data rate and throughput and may be used for other types of patterning where these characteristics are useful: photo-setting, printing, engraving, security marking, etc. The rotor has a smooth movement and small mechanical overhead even at high rotation speeds, e.g. 60, 120, 300, 600 r.p.m. or higher. The scanning speed, which is the peripheral speed of the rotor, may be higher than comparable reciprocating systems, e.g. 2, 4, 8, 20 m/s or higher.

In practical terms, one implementation would have a rotor one meter in diameter, spinning 3.3 turns per second with a centripetal acceleration of 20 g. The acceleration force gives a constant force on rotating components, such that a lens weighing 50 grams will feel a constant force outwards of 10 N. With four arms and rotational speed, the system writes 13 strokes per second with a peripheral velocity of 10 m/s, a mechanical speed that is impractical with a reciprocating stage. Furthermore, with proper balancing and design of the bearings the motion will be smooth, have high mechanical precision and need little power to be sustained. If the image generator is an SLM with constant 2 MHz frame rate used, the reloading of the SLM would occur every 5 microns along the scanning direction and the pixel size could be 5×5 microns, allowing line width of less than 15 microns to be written.

This rotor has a curvilinear sweep path. When the rotor is at the +/−60 degree orientation, the sweep path is about 45 degrees to the pattern orientation, for many patterns. This makes it necessary to recalculate the pixel values for each reloading of the SLM image. However, the sweep progresses by only a fraction of the projected SLM height with each reloading of the SLM. Therefore, much of the data needed to recalculate the pixel values will be at hand from the last reload.

Figure 5:
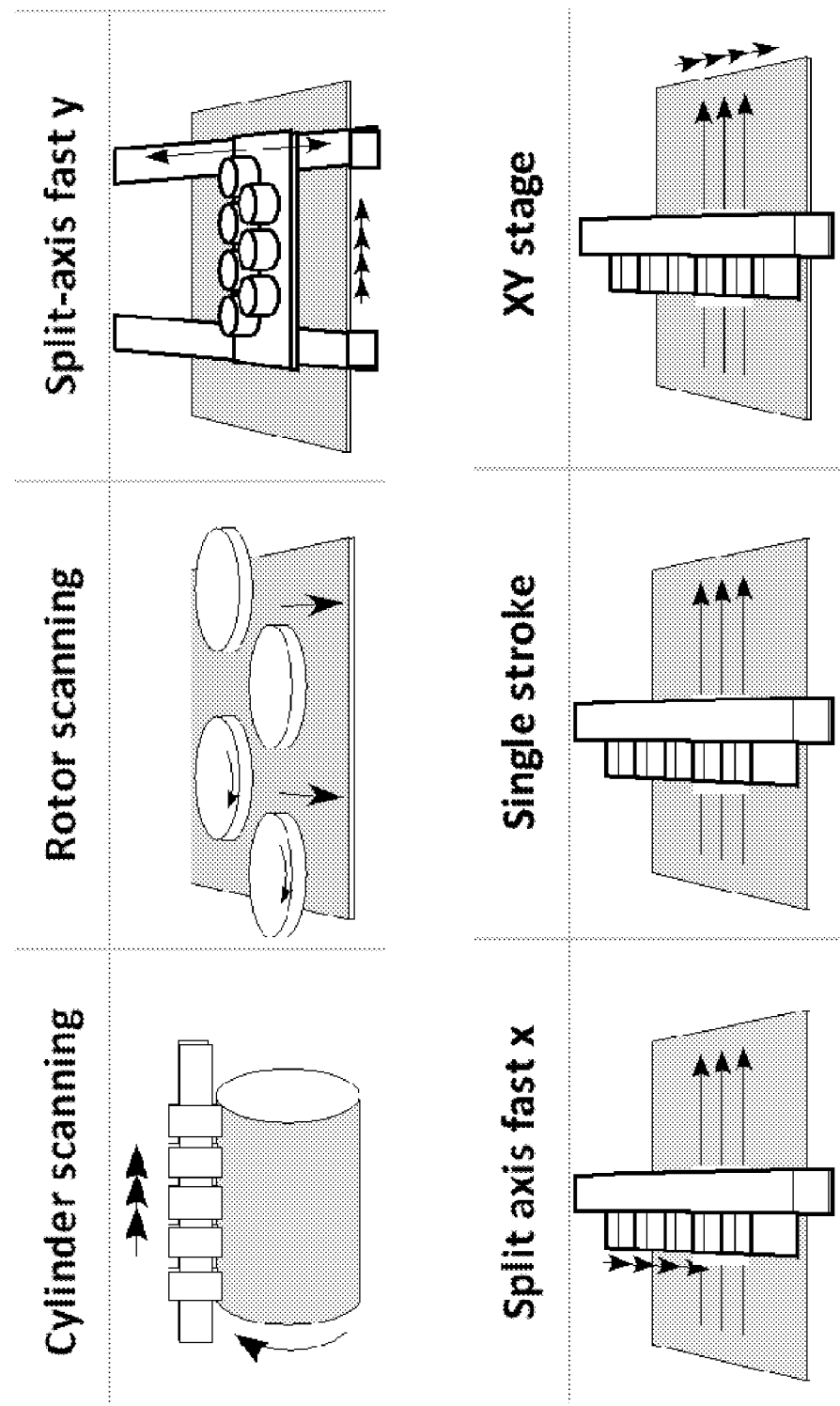
FIG. 5 depicts several systems that use straight sweep paths.

FIG. 5 depicts a variety of systems that use straight sweep paths. When the sweep path is straight, a shift buffer can reuse the data between row of pixels. This is done by synchronizing the shift frequency with the time required to sweep one pixel height, as described by Meisburger in U.S. Pat. No. 7,719, 753. As an improvement on Meisburger, which uses on-off pixels, instead of diffractive gray-scaled pixels, two or more shift buffers could be used with the SLM reload frequency set to an integer multiple of the shift frequency that synchronizes with the time that it takes to sweep one pixel height. With two shift buffers, gray scale pixel values could be calculated that align rows with pixel middle and edge positions. The SLM would then be loaded alternately from the two shift buffers, doubling the reload frequency without requiring complete recalculation for each reload.

FIG. 2 further illustrates use of a so-called one-dimensional SLM with anamorphic optics, which we contrast to 1.5D optics. More detail regarding this configuration is found in U.S. 2010/0208329 A1, which is hereby incorporated by reference. A light source 205 (arc lamp, gas discharge, laser, array of lasers, laser plasma, LED, array of LEDs etc.) illuminates a one-dimensional SLM 204. The reflected (or transmitted in the general case) radiation is projected as a line segment 203 on a workpiece 201. The data driving the SLM changes as the workpiece is scanned 207 to build up an exposed image. A strongly anamorphic optical system 206 concentrates energy from multiple mirrors in a column (or row) to point in the image and the entire two-dimensional illuminated array forms a narrow line segment 203 that is swept across the workpiece. In one dimension, the anamorphic optics demagnify the illuminated area, for instance, by 2× to 5×, so the a 60 millimeter wide SLM would image onto a line segment 30 to 12 mm long. Along the short dimension, the anamorphic optics strongly demagnify the column of mirrors to focus onto a narrow area such as 3 microns wide, i.e. essentially a single resolved line. Alternatively, the area could be 1 or 5 microns wide or less than 10 microns wide. Focus onto a 3 micron wide area could involve an 80× demagnification, from approximately 240 microns to 3 microns. The anamorphic optical path demagnifies the row of mirrors to an extent that individual mirrors are combined and not resolved at the image plane. As described in related applications, the SLM could be positioned in a plane that is in sharp focus along one dimension of the SLM and de-focused along the other dimension. This would decrease the criticality of the lens system.

In contrast, the 1.5D SLM would use less anamorphic optics. In one implementation, in which micro mirrors have a projected width along the long axis of 10 microns each, five rows of micro mirrors might have a projected height along the narrow access of 50 microns, making the projected mirrors on the image plane essentially square, meaning that the x and y dimensions of a pixel in the image is essentially equal, or in the range 1:2 to 2:1. This can be illustrated by reference to FIG. 2, in which seven essentially square (H-shaped) micro mirrors function as a single pixel. Similarly, in FIG. 3, fourteen micro mirrors are illustrated as functioning as two pixels. In either instance, with a projected pixel length (center to center distance) along the long axis, the projected height of seven micro mirrors functioning as a single pixel would be 6.7 to 10 microns. For five pixels high, the projected height would be 33.3 to 50 microns. With this more limited demagnification, individual gangs of mirrors functioning as a single pixel would be projected to distinct, if overlapping locations. Thus, interference and diffraction effects along the narrow axis would produce coherent effects. That is, overlapping projections from adjoining mirrors with matching phases would have additive amplitudes. Overlapping projections with opposed phases would have subtractive amplitudes.

Negative amplitudes (so-called negative black) can be used to sharpen edge contrast, taking advantage of subtractive amplitudes. /Reference to application/

The laser energy is switched by polarization control 132 between the two SLMs 147 and 149, and the data stream is also switched between the SLMs. Since the laser 120 and the data path 135 are among the most expensive modules in a writing machines, this embodiment has been designed to use laser and data channel 100% of the time while the SLMs and the optics in the arms have lower duty cycles, 50% and 33% respectively. This may be, for instance, an example of a writing system with three rotating arms 140A-C. There are a variety of alternative designs for these arms and the relay optics. The figure conceptually depicts a laser 120 and a controller 135 sending data to two SLMs 130 which are relayed 132, 147, 149 to the rotating arms. It shows how each arm moves in front of each SLM and writes a series of concentric stamps on the workpieces 111, 112. While two workpieces are shown in this figure, more workpieces could be positioned under a rotor, depending on its size. While the example is described as a writing system, the direction of relay could just as easily be from the workpiece back to a pair of detectors positioned where the laser 120 is and elsewhere. In alternative configurations, one workpiece might be used; four arms might be used.

Some particularly useful applications of this technology involve writing patterns on electronic substrates, such as: wafers' front and back sides; PCBs; build-up, interposer and flexible interconnection substrates; and masks, stencils, templates and other masters. Likewise, the rotor writer can be used for patterning panels in displays and for flexible electronic paper, plastic logic and photovoltaic cells. The patterning can be done by exposure of photoresist, but also through other actions of light such as thermal or photochemical processes: melting, evaporation, ablation, thermal fusing, laser-induced pattern transfer, phase-change, annealing, pyrolytic and photo induced etching and deposition.

SOME PARTICULAR EMBODIMENTS

The technology disclosed includes a micro lithographic system that exposes a radiation sensitive layer over a workpiece. The system includes a long and narrow SLM, that is at least 1000 micro mirrors along the long axis and from 2 to 20 micro mirrors along the narrow axis. This SLM operates in a diffraction mode to modulate and relay radiation. The system further includes an illuminator that illuminates the SLM with locally coherent and continuous or quasi-continuous radiation. By quasi-continuous radiation, we mean pulsed radiation with a repetition rate that is at least 5 times higher than the rate at which data that modulates the SLM is reloaded and not synchronized to the data, or it may be any integer times the reloading frequency if synchronized. In many instances, the quasi-continuous radiation is in the hundred megahertz pulse frequency range, while the reloading frequency may be in the 1 to 2 MHz range. The system further includes relay optics that project the radiation from the SLM micro mirrors onto an image plane. This projection affords a distinct mapping for the micro mirrors to the image plane that uses local clearance along the narrow axis to produce additive and subtractive coherent intensity effects. These coherent intensity effects include reducing the combined amplitude of radiation from adjoining mirrors, resulting in diffraction and sharpening edged definition on the image plane. The system further includes sweep mechanics that sweep the projected radiation across the image plane as the SLM modulates the projected radiation.

Optionally, the system sweeps a straight line across the workpiece. In that case, the system may include at least one shift buffer that allows data that modulates the SLM to shift through the buffer without recalculation as the sweeper mechanics advance the sweep, thereby decreasing calculation burdens for the data that modulates the SLM. As described above, this allows for recalculation or reloading of only a portion of the data at one edge of the shift buffer with each advance of the sweep.

Alternatively, the sweep mechanics may sweep a curvilinear path across the workpiece. Then, the system must include logic to recalculate or reload data that modulates the SLM continuously, as the sweep mechanics advance the sweep.

In some implementations, the micro mirrors may have a high aspect ratio, greater than or equal to 2:1 along the narrow axis of the SLM. In these implementations, the relay optics demagnify radiation from the SLM with a higher demagnification along the narrow axis than along the long axis. Sometimes, the anamorphic demagnification produces a squarish projected area on the workpiece of the high aspect ratio micrometers. By "squarish," we mean having an aspect between 2:1 and 1:2.

In some implementations, the SLM is 10 or fewer micro mirrors wide along the narrow axis.

The technology disclosed also includes a method that uses the so-called 1.5D SLM. This method involves patterning a substrate with a long, narrow SLM, at least 1000 μmicro mirrors long and from 2 to 20 micro mirrors wide. The method includes operating the SLM in a diffraction mode to modulate and relay radiation. It includes illuminating the SLM with locally coherent and continuous or quasi-continuous radiation. The meaning of quasi-continuous is explained above. The method further includes sweeping radiation relayed from the SLM across an image plane through relay optics that project the swept radiation with a distinct mapping from the SLM pixels onto the image plane, which mapping takes advantage of local coherence along the SLM's narrow axis for additive and subtractive coherence properties and to sharpen edge locations. The apparatus discussion of additive and subtractive coherence properties and edge sharpening applies to this method.

The method optionally involves sweeping the radiation in essentially a straight line across the workpiece. Practicing this alternative, the method may further include shifting data that modulates the SLM through a shift buffer without recalculation as the sweep advances, thereby decreasing calculation burdens for the data that modulate the SLM.

Alternatively, the method may involve sweeping the radiation along a curvilinear path. In that implementation, the method may involve recalculating data for rows in the SLM as the sweep advances.

Sometimes, this method is practiced using pixels that have a high aspect ratio, greater than or equal to 2:1 along the narrow axis of the array. Then, the method further includes the relay optics anamorphically demagnifying radiation from the SLM with higher demagnification along the narrow axis. In some instances this anamorphic demagnification may produce a squarish projected area on the workpiece from the high aspect ratio pixels.

In some implementations, this method is practiced using an SLM that is 10 or fewer micro mirrors wide along the narrow axis. It is contemplated that modifications and combinations will readily occur to those skilled in the art, which modifications and combinations will be within the spirit of the invention and the scope of the following claims.

I claim as follows:

1. A microlithographic system that exposes a radiation sensitive layer over a workpiece, the system including:
   an SLM, at least 1000 micro mirrors on a long axis and from 2 to 20 micro mirrors on a narrow axis, operating in diffraction mode to modulate and relay radiation;
   an illuminator that illuminates the SLM with locally coherent and continuous or quasi-continuous radiation;
   relay optics that project the radiation from the SLM micro mirrors onto an image plane with distinct mapping from the micro mirrors that uses local coherence to produce additive and subtractive coherent intensity effects and to sharpen edge definition on the image plane; and
   sweep mechanics that sweep the projected radiation across the image plane as the SLM modulates the projected radiation.

2. The system of claim 1, wherein the sweep mechanics sweep a straight line across the workpiece, further including a at least one shift buffer that allows data that modulates the SLM to shift through the buffer without recalculation as the sweep mechanics advance the sweep, thereby decreasing calculation burdens for the data that modulates the SLM.

3. The system of claim 1, wherein the sweep mechanics sweep a curvilinear path across the workpiece, further including logic to recalculate data that modulate the SLM continuously as the sweep mechanics advance the sweep.

4. The system of claim 1, wherein the illuminator illuminates the SLM at a repetition rate that is at least 100 times higher than the rate at which data that modulates the SLM is reloaded.

5. The system of claim 1, wherein the micro mirrors have a high aspect ratio, greater than or equal to 2 to 1 along the narrow axis of the SLM, and the relay optics anamorphically demagnify radiation from the SLM with higher demagnification along the narrow axis.

6. The system of claim 5, wherein the high aspect ratio micro mirrors are anamorphically demagnified to a squarish projected area on the workpiece.

7. The system of claim 1, wherein the SLM is 10 or fewer micro mirrors wide along the narrow axis.

8. A method of patterning a substrate using an SLM, at least 1000 micro mirrors long and from 2 to 20 micro mirrors wide, the method including:
   operating the SLM in a diffraction mode to modulate and relay radiation;
   illuminating the SLM with locally coherent and continuous or quasi-continuous radiation;
   sweeping radiation relayed from the SLM across an image plane through relay optics that project the swept radiation with a distinct mapping from the SLM pixels onto the image plane, which mapping takes advantage of local coherence for additive and subtractive coherence properties and to sharpen edge locations.

9. The method of claim 8, further including:
   sweeping the radiation in essentially a straight line across the workpiece; and
   shifting data that modulates the SLM through a shift buffer without recalculation as the sweep advances, thereby decreasing calculation burdens for the data that modulate the SLM.

10. The method of claim 8, further including:
    sweeping the radiation along a curvilinear path across the workpiece;
    recalculating data that modulate the SLM continuously as the sweep advances.

11. The method of claim 8, further including illuminating the SLM at a quasi-continuous pulse repetition rate that is at least 100 times higher than the rate at which data that modulates the SLM is reloaded.

12. The method of claim 8, wherein the micro mirrors have a high aspect ratio, greater than or equal to 2 to 1 along the narrow axis of the SLM, further including the relay optics anamorphically demagnifying radiation from the SLM with higher demagnification along the narrow axis.

13. The method of claim 12, wherein the high aspect ratio micro mirrors are anamorphically demagnified to a squarish projected area on the workpiece.

14. The method of claim 8, wherein the SLM is 10 or fewer micro mirrors wide along the narrow axis.

* * * * *